United States Patent
Sachdev

[11] Patent Number: 5,831,463
[45] Date of Patent: Nov. 3, 1998

[54] MOS MASTER-SLAVE FLIP-FLOP WITH REDUCED NUMBER OF PASS GATES

[75] Inventor: Manoj Sachdev, Eindhoven, Netherlands

[73] Assignee: U.S. Philips Corporation, New York, N.Y.

[21] Appl. No.: 696,311

[22] Filed: Aug. 13, 1996

[30] Foreign Application Priority Data

Aug. 14, 1995 [EP] European Pat. Off. .............. 95202203

[51] Int. Cl.[6] ....................... H03K 19/173; H03K 3/3562
[52] U.S. Cl. ........................... 327/202; 327/203; 327/199
[58] Field of Search ................................ 327/202, 203, 327/199

[56] References Cited

U.S. PATENT DOCUMENTS

| 4,495,628 | 1/1985 | Zasio | 377/70 |
| 4,656,368 | 4/1987 | McComb et al. | 307/272 A |
| 5,107,137 | 4/1992 | Kinugasa | 307/272.2 |
| 5,189,315 | 2/1993 | Akata | 307/272.2 |
| 5,612,632 | 3/1997 | Mahant-Shetti et al. | 326/46 |

FOREIGN PATENT DOCUMENTS

0633530A2  1/1995  European Pat. Off. .

*Primary Examiner*—Timothy P. Callahan
*Assistant Examiner*—An T. Luu
*Attorney, Agent, or Firm*—Brian J. Wieghaus

[57] ABSTRACT

A master-slave flip-flop has master and slave latches cascaded between an input and an output. Each latch has two inverters directly connected to one another head to tail. The latches are coupled via a buffer and a clock controlled pass gate. This architecture reduces the number of pass gates and clock lines, improves hold time and enhances $I_{DDQ}$-testability with respect to known flip-flops.

14 Claims, 2 Drawing Sheets

5,831,463

MOS MASTER-SLAVE FLIP-FLOP WITH REDUCED NUMBER OF PASS GATES

FIELD OF THE INVENTION

The invention relates to an electronic circuit with at least one master-slave flip-flop. The flip-flop comprises a data input, a data output and a clock input. The flip-flop further has a clock-controlled pass gate, a master latch between the data input and the pass gate, and a slave latch between the pass gate and the data output. Each respective one of the latches comprises respective first and second logic gates coupled anti-parallel. The flip-flop further includes a buffer with a buffer input coupled to the master latch and with a buffer output coupled to the slave latch.

BACKGROUND ART

A static flip-flop is an important building block in the design of digital CMOS integrated circuits. A typical digital CMOS integrated circuit may contain several thousands of flip-flops. A typical master-slave flip-flop comprises a master latch and a slave latch interconnected through a transmission gate. Each respective one of the latches includes another transmission gate in the feedback loop formed by the first and second logic gates. This other transmission gate enables conflict-free writing and latching of the data. In operational use of the flip-flop the master and slave are alternately enabled to accept or store data under complementary control of the transmission gates, so as to functionally disconnect the flip-flop's input from its output.

A flip-flop as specified in the preamble is known from U.S. Pat. No. 5,189,315 issued to Akata, and comprises an inverting buffer. The buffer blocks the master from undesirable influence of the slave and renders the flip-flop suitable for higher clock rates than achievable in un-buffered flip-flops. Apart from the buffer, the known flip-flop has a conventional configuration in that each of the latches includes a respective further clock-controlled pass gate.

OBJECT OF THE INVENTION

It is, inter alia, an object of the invention to provide a master-slave flip-flop of the type named in the preamble that needs fewer components and less substrate area than the prior art flip-flop, yet without a substantial loss in performance.

SUMMARY OF THE INVENTION

To this end, the invention provides a circuit as specified in the preamble, characterized in that in at least the master latch or the slave latch, inputs of the first and second logic gates are directly connected to outputs of the second and first logic gates, respectively.

The configuration of at least the master or the slave latch is now similar to that of an SRAM cell. The latch having the logic gates directly interconnected now lacks the pass gate of the prior art. This saves substrate area that otherwise would have been used for the pass gate itself, the clock leads and their contacts. In addition, the clock driver now has to drive fewer gate capacitances per flip-flop than in the prior art. If the master latch in the circuit of the invention does not have a pass gate, then the master is written by a circuit that precedes the flip-flop and whose driving capability suffices to overwrite the master latch. The master itself can be kept fairly small. The task of the master latch now is data retention only. It is the buffer, and not the master, that writes the slave. Accordingly, the driving capability of the circuit preceding the master only needs to be slightly adapted, if at all, to the novel configuration of the flip-flop of the invention. If the slave latch in the circuit of the invention does not have a pass gate, then the buffer provides sufficient driving power to overwrite the slave. Since the buffer forms a uni-directional coupling, there is no need for a pass gate in the slave in order to prevent the master from being overwritten by the slave.

Within the context of the invention, the expression "pass gate" is used herein to cover any controllable passage, such as a clocked transmission gate, but also to indicate the controllable passage feature merged with the buffer such as provided by a clocked inverter. The pass gate may comprise a conventional parallel arrangement of an NFET and a PFET receiving complementary clock signals as in the cited prior art reference, or a single PFET or NFET. Alternatively, the pass gate may be functionally merged with the buffer such as in a clocked CMOS inverter. A clocked inverter may comprise, between the supply voltage and ground, a series arrangement of two PFETs and two NFETs, wherein one of the PFETs and one of the NFETs receive the signal from the master latch, and wherein the other PFET and NFET receive complementary clock signals.

If the buffer and pass gate are not merged, the buffer output is preferably coupled to the slave latch via the pass gate. That is, in the signal path from the data input to the data output the buffer precedes the pass gate. This configuration prevents the buffer from having a floating input each time the pass gate is blocked. Preferably, the first and second logic gates of the master are kept outside the signal path from the data input to the buffer input, so as to reduce gate delays.

Experiments indicate that the absence of pass gates in the latches and the presence of the buffers in the direct signal path enable the clock rate to increase. The flip-flop of the invention provides a lower (more negative) hold time and therefore functions well in a clock-skew environment. The design of the clocking scheme, the distribution and generation of clock signals can be simplified. In addition, the signal path now being rendered uni-directional due to the presence of one or more buffers, contributes significantly to the fault coverage in $I_{DDQ}$-testing as is explained below. Consequently, the invention provides a flip-flop circuit that has fewer clock lines and components and is better testable than conventional un-buffered flip-flops as is discussed below.

DESCRIPTION OF THE DRAWING

The invention is explained below in further detail and by way of example with reference to the accompanying drawing, wherein.

Figure 1:
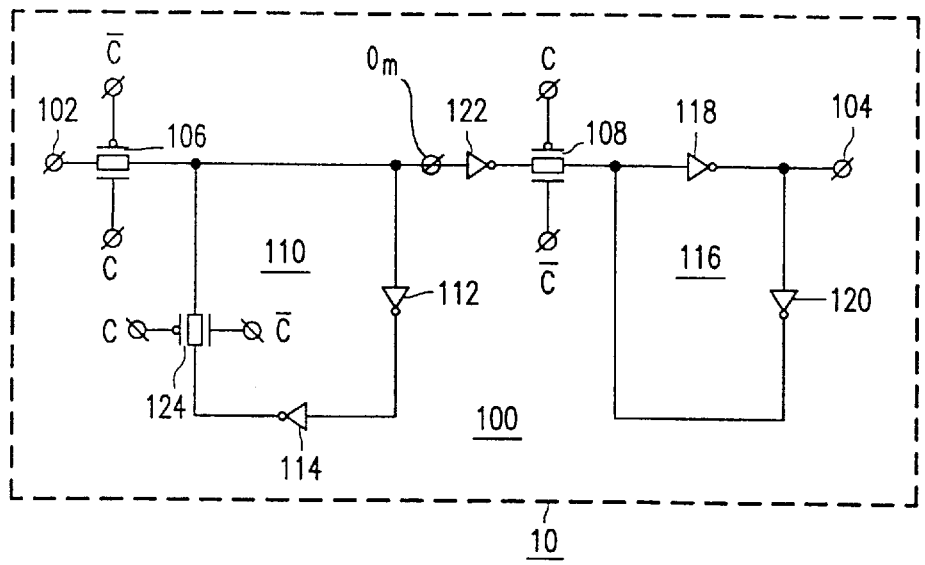
FIGS. 1, 2 and 3 are diagrams of embodiments of a flip-flop in a circuit according to the invention.

Throughout the drawing like reference signs indicate corresponding or similar features.

DETAILED EMBODIMENTS

FIG. 1 is a diagram of a circuit 10 with a first embodiment of a flip-flop 100 of the invention. Flip-flop 100 comprises an input 102 and an output 104; first and second pass gates 106 and 108, each controlled by two complementary clock signals C and CBAR; a master latch 110 with first and second inverters 112 and 114; a slave latch 116 with first and second inverters 118 and 120; and a buffer 122 implementing a uni-directional coupling between master 110 and slave 116 via pass gate 108. Master 110 includes a clock-controlled pass gate 124. Slave 116 has no clock-controlled pass gate.

Data at input 102 is conventionally written into master 110 when pass gate 106 is conducting and pass gates 108 and 124 are blocked. Thereupon, pass gates 108 and 124 are rendered conductive and pass gate 106 is blocked under clock control. Then, the positive feedback in latch 110 is restored and the data written into master 110 is retained. Also, inverter 122 now writes slave 116 via conductive pass gate 108. The operation of inverter 122 is unidirectional and since, therefore, master 110 cannot be overwritten by slave 116, there is no need for a pass gate in slave 116.

Note that buffer 122 is located preferably upstream of pass gate 108. If buffer 122 was arranged downstream of pass gate 108 and in front of slave latch 116, buffer 122 would have a floating input each time pass gate 108 was blocked. This is undesirable since the input to buffer 122 then is liable to get discharged by a leakage current, thus forcing slave 116 into an unintended logic state under some circumstances.

Figure 2:
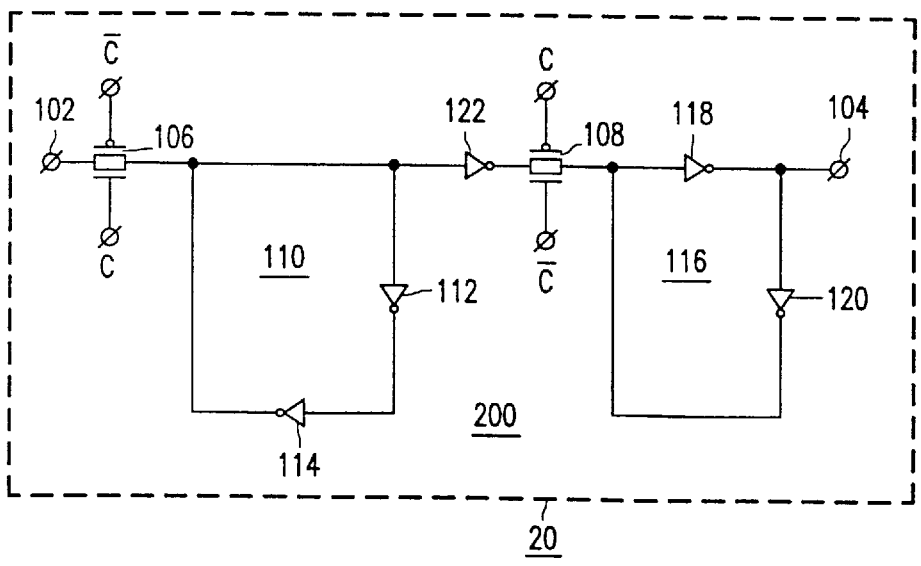

FIG. 2 is a diagram of a second embodiment of a circuit 20 with a flip-flop 200 in accordance with the invention. Flip-flop 200 differs structurally from flip-flop 100 in that master latch 110 now does not include a pass gate 124. The driving capability of a preceding circuit (not shown) connected to input 102 need only be enough to overcome the driving power of inverter 114. Since buffer 122, and not inverter 114, is to overwrite slave 116, the driving capability of inverters 112 and 114 of master 110 can be kept small. As a result, the driving circuit at input 102 need not be adapted to the configuration of master 110. The configuration of flip-flop 200 is attractive for small flip-flops and for low-power applications due to the smaller number of elements and due to the fact that the clock driver (not shown) has to drive a smaller number of gate capacitances.

Figure 3:
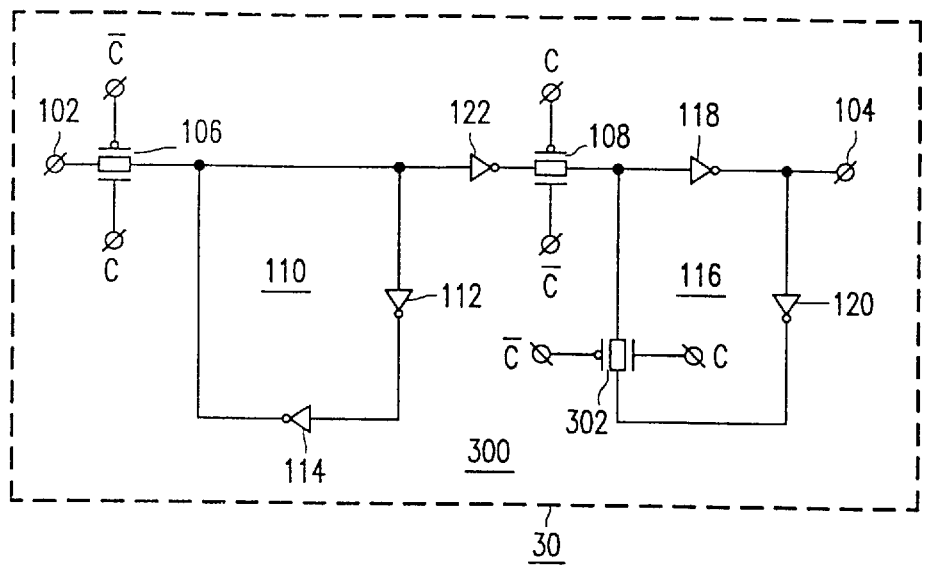

FIG. 3 is a diagram of a third embodiment of a circuit 30 with a flip-flop 300 according to the invention. Flip-flop 300 differs from flip-flop 100 in that now inverters 112 and 114 of master 110 are directly interconnected and in that slave 116 comprises a clock controlled pass gate 302. Flip-flop 300 is relatively more expensive in substrate area than flip-flop 200. However, flip-flop 300 offers less propagation delay because pass gate 302 in the feedback path of slave latch 116 assists is quickly overwriting the data latched in slave 116.

Figure 4:
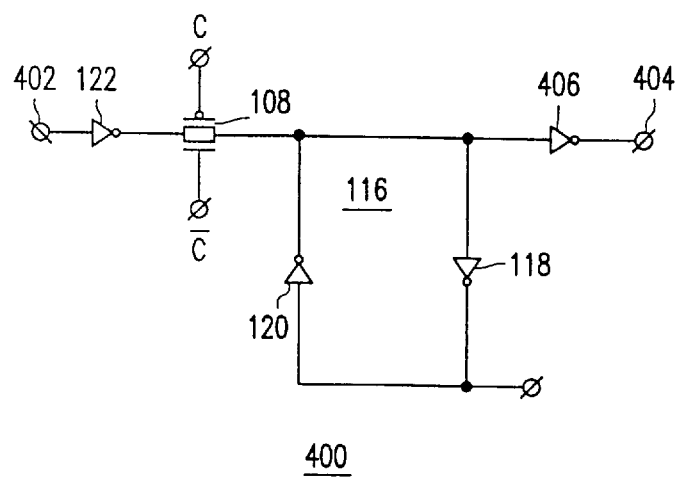
FIG. 4 is a diagram of a part of the flip-flop of FIGS. 1 and 2 for use as a building block.

The arrangement of buffer 122, pass gate 108 and slave 116 of flip-flops 100 and 200 is a building block interesting on its own. FIG. 4 is a diagram of this block 400, further provided with an input 402, an output 404 and a further buffer 406. Any combination of multiple building blocks 400, e.g., to form a shift register, has advantages similar to those discussed above and below.

Note that inverters 112 and 114 are kept outside the signal path from input 102 to buffer 122.

Also note that buffer 122 and pass gate 108 can, in alternative embodiments, be functionally integrated into a clocked inverter. Inverters 112, 114, 118 and 120 may be replaced by other logic gates such as logic NOR gates or logic NAND gates.

Static flip-flops such as fabricated in CMOS, all share the same problem that particular bridging defects causing stuck-at faults cannot be detected through quiescent current measurements, also referred to as $I_{DDQ}$-testing, without special provisions. Bridging defects are considered the single most important manufacturing defect-mechanism responsible for yield loss. Special Design-for-Testability measures are required in order to enable detection of such defects in flip-flops under $I_{DDQ}$-testing. $I_{DDQ}$-testing is recognized as the quality-improving complement to Boolean testing and among experts the opinion prevails that the quality achieved through $I_{DDQ}$ test techniques is not matched by any other test method.

Specific low-resistive bridging defects in a master-slave flip-flop cannot be detected by $I_{DDQ}$-testing save by rendering the flip-flop transparent according to the method cited in European patent application 0 633 530 of the same inventor. This method, however, requires additional circuitry to effect the transparency. The present invention, however, utilizes the insight that rendering the flip-flop or chains of flip-flops transparent is not necessary if the coupling between master and slave is unidirectional. The controllable coupling is conventionally implemented by a transmission gate. Such a bi-directional path between the master and slave, however, enables overwriting of the master, e.g., by a bridging defect in the slave, during data transfer from master to slave. The overwriting occurs as a consequence of a voltage conflict during this transitory phase and will go undetected in a quiescent state. The inventor has found that, if the controllable coupling between the master and slave is unidirectional at least during testing, the voltage conflict will persist without affecting the data of the master and will therefore be detectable by $I_{DDQ}$-testing.

The driving capability of the buffer both enables overwriting the slave during normal operational use, and sustains the quiescent current in case of a voltage conflict caused by a $I_{DDQ}$-detectable defect. Accordingly, the inventor has recognized that it is not the driving capability of the master which is relevant to operational use and testing, but the driving capability of the buffer. Therefore, the master's inverters are better kept out of the signal path that runs between input and output of the flip-flop, in order to reduce propagation delay in a flip-flop with unidirectional coupling. In the flip-flop of U.S. Pat. No. 5,189,315 referred to under the "Background" section, the signal path includes a master inverter, thus inflicting an extra, unnecessary propagation delay.

I claim:

1. An electronic circuit with at least one master-slave flip-flop, the flip-flop comprising:

a data input, a data output and a clock input (C);

a pass gate controlled by the clock input;

a master latch between the data input and the pass gate, and a slave latch between the pass gate and the data output, wherein each respective one of said latches comprises respective first and second logic gates, the logic gates of one of said master latch and said slave latch being coupled electrically in series and the logic gates of the other of said master latch and said slave latch being coupled anti-parallel;

a buffer with a buffer input coupled to the master latch and with a buffer output coupled to the slave latch; and in at least one of the master latch and the slave latch, the first and second logic gates are unclocked and inputs of the first and second logic gates are directly connected to outputs of the second and first logic gates, respectively.

2. The circuit of claim 1, wherein the buffer output is coupled to the slave latch via the pass gate.

3. The circuit of claim 2, wherein the first and second logic gates of the master are kept outside a signal path from the data input to the buffer input.

4. The circuit of claim 3, wherein the buffer is functionally integrated with the pass gate.

5. An electronic circuit comprising:

a input node and an output node;

a first buffer having a buffer input connected to the input node and having a buffer output;

a latch with first and second unlocked logic gates connected head to tail;

a pass gate connected between the buffer output and the latch;

a further buffer connected to the latch and to the pass gate.

6. The circuit of claim 2, wherein the buffer is functionally integrated with the pass gate.

7. An electronic circuit according to claim 1, wherein said logic gates are inverters.

8. An electronic circuit according to claim 2, wherein said logic gates are inverters.

9. An electronic circuit according to claim 3, wherein said logic gates are inverters.

10. An electronic circuit according to claim 4, wherein said logic gates are inverters.

11. An electronic circuit according to claim 5, wherein said logic gates are inverters.

12. An electronic circuit according to claim 6, wherein said logic gates are inverters.

13. A master-slave flip-flop, comprising:

a data input, a clock input and a data output;

a master latch having an input coupled to said data input and an output;

a slave latch having an input, and an output coupled to said data output;

a pass gate, controlled by said clock input, coupled between said output of said master latch and said input of said slave latch, and each of said master and slave latches including first and second logic gates, at least one of said latches being free of a clock controlled pass gate.

14. A master-slave flip-flop, comprising:

a data input, a clock input and a data output;

a master latch having ah input coupled to said data input and an output;

a slave latch having an input, and an output coupled to said data output;

each of said master and slave latches including first and second logic gates, at least one of said latches being free of a clock controlled pass gate; and a unidirectional coupling between the output of the master latch and the input of the slave latch allowing flow of data from the master latch to the slave latch but not from the slave latch to the master latch.

* * * * *